US008390335B2

(12) United States Patent
Lei et al.

(10) Patent No.: US 8,390,335 B2
(45) Date of Patent: Mar. 5, 2013

(54) SIGNAL BUFFER AMPLIFIER

(75) Inventors: Gong Tom Lei, Austin, TX (US); Yincai Liu, Santa Clara, CA (US); Minsheng Li, Santa Clara, CA (US); Jun Xiong, Santa Clara, CA (US)

(73) Assignee: FutureWei Technologies, Inc., Plano, TX (US)

( * ) Notice: Subject to any disclaimer, the term of this patent is extended or adjusted under 35 U.S.C. 154(b) by 196 days.

(21) Appl. No.: 12/818,845

(22) Filed: Jun. 18, 2010

(65) Prior Publication Data

US 2010/0327944 A1 Dec. 30, 2010

Related U.S. Application Data

(60) Provisional application No. 61/220,103, filed on Jun. 24, 2009.

(51) Int. Cl.
 *H03K 3/00* (2006.01)
(52) U.S. Cl. ..................................... 327/108
(58) Field of Classification Search .................. None
See application file for complete search history.

(56) References Cited

U.S. PATENT DOCUMENTS

| 4,493,092 | A | * | 1/1985 | Adams | 375/257 |
| 5,362,199 | A | * | 11/1994 | Gandolfo | 414/788 |
| 5,550,495 | A | | 8/1996 | Fotouhi | |
| 6,563,351 | B2 | * | 5/2003 | Onizawa et al. | 327/108 |
| 6,670,990 | B1 | | 12/2003 | Kochi et al. | |
| 6,727,729 | B2 | * | 4/2004 | Brooks et al. | 326/68 |
| 7,049,848 | B2 | * | 5/2006 | Brooks et al. | 326/68 |
| 7,656,185 | B2 | * | 2/2010 | Kim et al. | 326/14 |

FOREIGN PATENT DOCUMENTS

| CN | 1197711 A | 11/1998 |
| CN | 1213931 A | 4/1999 |
| JP | 2009-91017 | 3/2003 |
| JP | 2004-289362 | 10/2004 |

* cited by examiner

*Primary Examiner* — Lincoln Donovan
*Assistant Examiner* — Khareem E Almo
(74) *Attorney, Agent, or Firm* — Slater & Matsil, L.L.P.

(57) ABSTRACT

A signal buffer amplifier with high linearity is provided. A circuit includes a first transistor having a first gate terminal, a first source terminal, and a first drain terminal. The circuit also includes a second transistor having a second gate terminal, a second source terminal, and a second drain terminal, the second drain terminal coupled to the first source terminal. The circuit further includes a first signal path coupled in between a signal input and the first gate terminal, a second signal path coupled in between the signal input and the second gate terminal, and a signal output coupled to the second source terminal. The first signal path includes a filter.

14 Claims, 3 Drawing Sheets

SIGNAL BUFFER AMPLIFIER

This application claims the benefit of U.S. Provisional Application No. 61/220,103, filed on Jun. 24, 2009, entitled "Signal Buffer Amplifier," which application is hereby incorporated herein by reference.

TECHNICAL FIELD

The present invention relates generally to signal processing, and more particularly to a signal buffer amplifier with high linearity.

BACKGROUND

Wireless communication applications have been a major driver in the development of high-speed high resolution analog-to-digital converters (ADC) with better alternating current (AC) performance in terms of signal-to-noise ratio (SNR) and spurious-free dynamic range (SFDR), as well as intermediate frequency (IF) sampling capability.

A major challenge in implementing such an ADC is preserving the high performance for high input frequencies. Generally, as the input frequency increases, the effect of input signal path nonlinearity becomes more detrimental to overall system performance. The detrimental impact of input signal path nonlinearity is especially true when large sampling capacitors, which are needed to achieve the high SNR requirement, are used.

Therefore a key to achieving high IF sampling performance is to create a low noise and low distortion input front-end capable of handling those high frequency signals. A buffer circuit plays a very critical role to achieve high linearity with IF sampling and to isolate the ADC's external driving network from the kick-back caused by the switching of the sampling capacitances.

FIG. 1 illustrates a buffer 100. Buffer 100 comprises a transistor 105, preferably a metal-oxide semiconductor field-effect transistor (MOSFET) device, arranged in a source follower configuration. Transistor 105 may be driven by a current source 110. Due to non-constant signal-dependent output impedance of a MOSFET device, buffer 100 often does not meet the high linearity requirements desired for many buffer circuit applications.

SUMMARY OF THE INVENTION

These and other problems are generally solved or circumvented, and technical advantages are generally achieved, by embodiments of a signal buffer amplifier with high linearity.

In accordance with a preferred embodiment of the present invention, a circuit is provided. The circuit includes a first transistor having a first gate terminal, a first source terminal, and a first drain terminal. The circuit also includes a second transistor having a second gate terminal, a second source terminal, and a second drain terminal, the second drain terminal coupled to the first source terminal. The circuit further includes a first signal path coupled in between a signal input and the first gate terminal, a second signal path coupled in between the signal input and the second gate terminal, and a signal output coupled to the second source terminal. The first signal path includes a filter.

In accordance with another preferred embodiment of the present invention, a circuit is provided. The circuit includes a first transistor, a first signal path coupled in between a signal input and a drain terminal of the first transistor, a second signal path coupled in between the signal input and a gate terminal of the first transistor, and a signal output coupled to a source terminal of the first transistor. The first signal path produces a level shifted voltage value at the drain terminal of the first transistor, and the level shifted voltage value is based on an input signal provided by the signal input.

In accordance with another preferred embodiment of the present invention, a circuit is provided. The circuit includes a first buffer having an input coupled to a first signal input, a second buffer having an input coupled to a second signal input, and a common mode loop having a first input coupled to a first output of the first buffer and a second input coupled to a second output of the second buffer. The first buffer buffers a first input signal provided by the first signal input, and the second buffer buffers a second input signal provided by the second signal input. The common mode loop sets a common mode voltage level of the circuit based on a reference voltage provided by a reference voltage source.

An advantage of an embodiment is that a circuit with an accurate output independent of a wideband nature of an input signal is provided. Therefore, an overall system performance remains consistent over an entirety of input signal frequency band.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely an analog linear input buffer for use in wideband high frequency ADC applications, such as moderate resolution and high signal bandwidth wireless communication applications, wherein the source follower configuration is a preferable structure. However, the embodiments may be applicable in applications wherein there is a need for signal buffers with a high degree of linearity, especially at higher frequencies.

Figure 1:
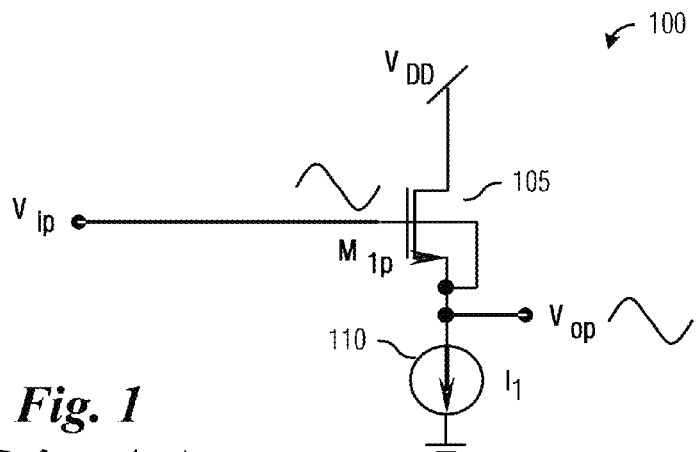
FIG. 1 is a diagram of a buffer.
Figure 2:
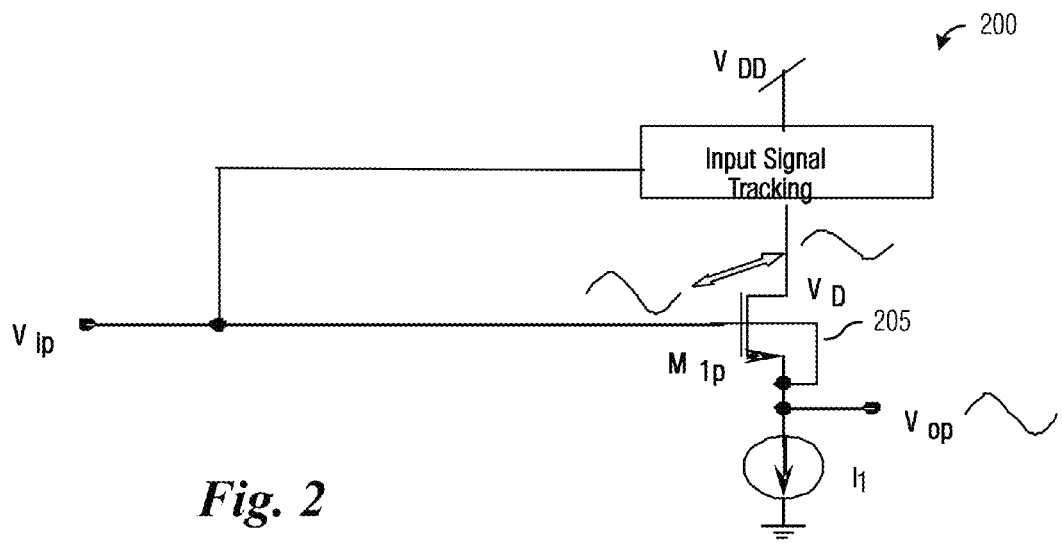
FIG. 2 is a diagram of an ideal buffer with high linearity.

FIG. 2 illustrates a buffer 200, wherein buffer 200 is an ideal buffer with high linearity. A main factor limiting the linearity of a source follower transistor based buffer is the non-constant signal-dependent output impedance of the MOSFET due to its channel length modulation effect. Perhaps the most effective way to solve the problem is to make the drain voltage ("$V_D$") of a MOSFET 205 ("$M_{1P}$") track the source voltage ("$V_{OP}$") of MOSFET 205 in both phase and amplitude such that the voltage difference between the drain and source of MOSFET 205 is kept constant (as shown in FIG. 2). Therefore the channel length modulation effect is minimized.

Figure 3:
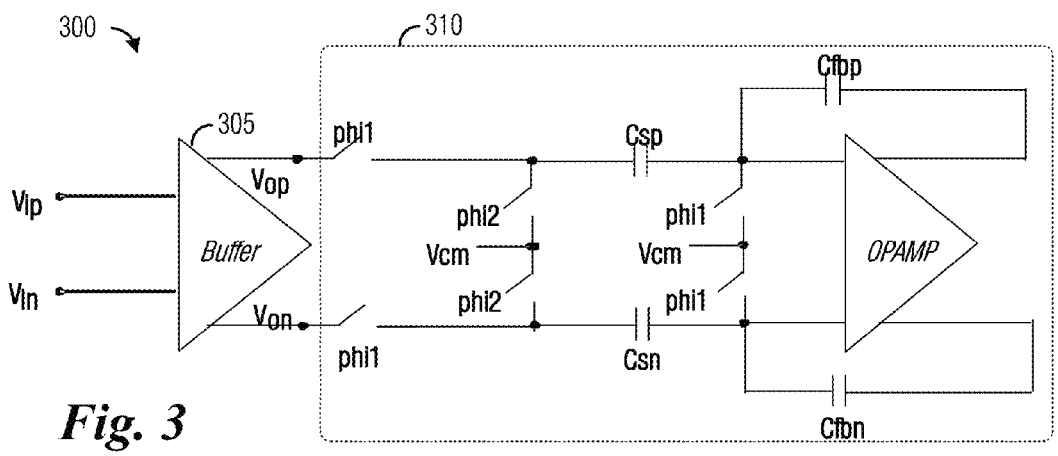
FIG. 3 is a diagram of circuit that includes a buffer with high linearity.

FIG. 3 illustrates a circuit 300, wherein circuit 300 includes a buffer 305 with high linearity. Buffer 305 may be used to drive a sample-and-hold circuit 310 for a typical switched-capacitor ADC front-end. In circuit 300, the low and flat output impedance of buffer 305 over a wide frequency range, as well as its accurately controlled common mode output voltage level, are both critical for a high performance design. As shown in FIG. 3, clocks phi1 and phi2 are non-overlapping clocks.

Figure 4:
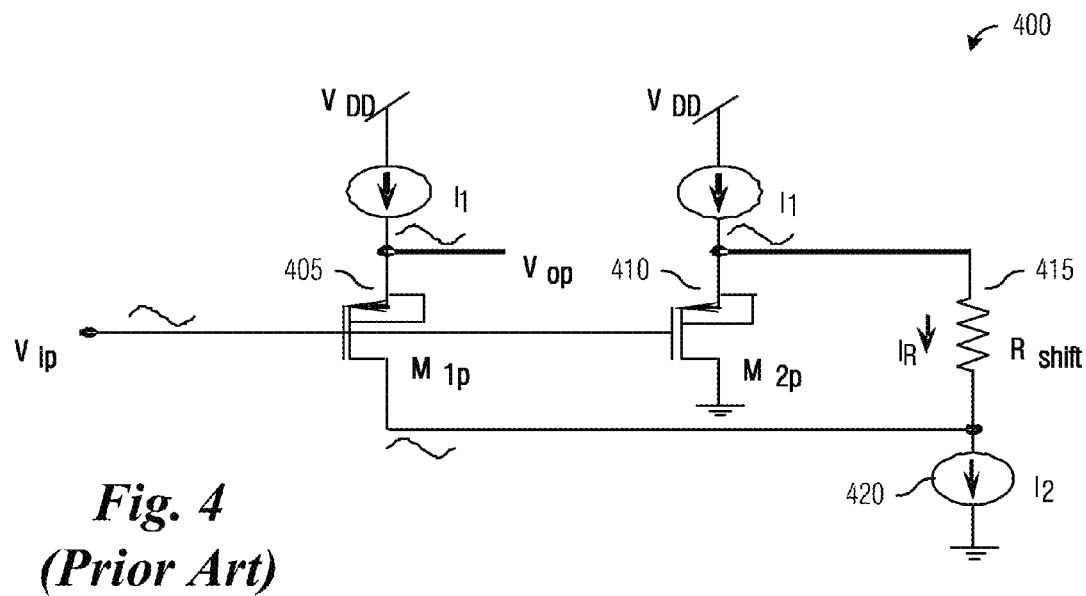
FIG. 4 is a diagram of a prior art buffer.

FIG. 4 illustrates a prior art buffer 400. Buffer 400 includes transistor 405 ("$M_{1P}$") and transistor 410 ("$M_{2P}$"). Transistor 410 may be used to generate a replica voltage substantially equal to an output voltage ("$V_{OP}$") of buffer 400 at a source terminal of transistor 405. The replica voltage may then be level shifted by a level shift circuit comprised of resistor 415 and current source 420. After being level shifted, the replica voltage may be applied at a drain terminal of transistor 405 to improve the linearity of buffer 400.

However, buffer 400 has a limitation that may limit its use in high frequency input signal applications. Due to a mismatched phase delay between the signal path through transistor 405 (the regular signal path) and the signal path through transistor 410 (the replica signal path), a voltage difference between the source terminal and the drain terminal of transistor 405 may not remain constant as the input signal frequency increases. Therefore, buffer 400 may not be able to remain linear as the input signal frequency increases. An additional drawback associated with buffer 400 is its requirement for additional headroom. Current source 420 at the drain terminal of transistor 405 raises the minimum required level for $V_{DD}$, which is undesirable for modern low voltage applications.

Figure 5:
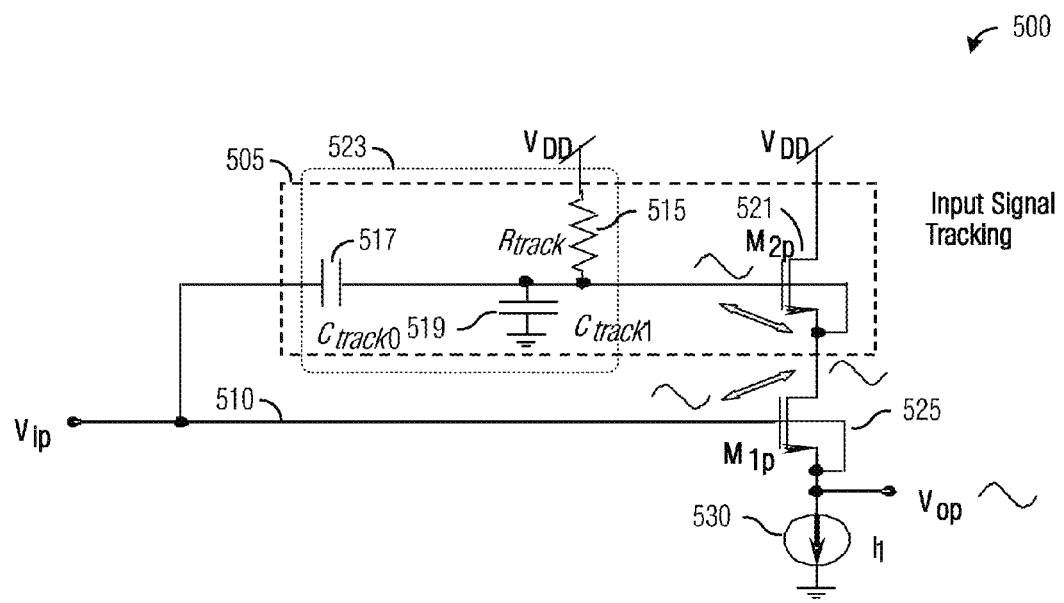
FIG. 5 is a diagram of a buffer, wherein the buffer has high linearity.

FIG. 5 illustrates a buffer 500, wherein buffer 500 has high linearity. As shown, buffer 500 includes two parallel signal paths from input $V_{IP}$ to output $V_{OP}$. A first path 505, also referred to as input signal tracking path, consists of a resistor 515 ("$R_{TRACK}$"), a first capacitor 517 ("$C_{TRACK0}$"), a second capacitor 519 ("$C_{TRACK1}$"), and a transistor 521 ("$M_{2P}$"). Collectively, first capacitor 517, second capacitor 519, and resistor 515 form a high pass filter (HPF) 523, which blocks low frequency components in input $V_{IP}$. A second path 510 consists of transistor 525 ("$M_{1P}$"). Preferably, both transistor 521 and transistor 525 are MOSFETs arranged in a source follower configuration. Preferably, transistor 525 is an N-channel MOSFET. A DC biasing voltage at a gate terminal of transistor 521 is driven to supply voltage (at $V_{DD}$).

With properly selected resistance and capacitance values, HPF 523 may have a 3 dB frequency corner that is designed according to a desired signal frequency range that is mainly limited by a lower end of the frequency range. For example, HPF 523 may have a 3 dB frequency corner that is significantly lower than the lower end of the frequency range. After being filtered by HPF 523, the filtered input $V_{IP}$ may be level shifted down through transistor 521. The level shifted and filtered input $V_{IP}$ may then be applied to a drain terminal of transistor 525. The source voltage of transistor 525 may be a level shifted input $V_{IP}$.

For an input signal with a sufficiently high frequency (above the 3 dB frequency corner of HPF 523), the drain voltage of transistor 525 driven through first path 505 will be able to track the source voltage of transistor 525 in amplitude as well as phase shift. Due to the wideband nature of the source follower transistor configurations used in first path 505 and second path 510, buffer 500 may be more preferred for high frequency applications. Additionally, there is only one current source (current source 530) instead of the two current sources present in prior art buffer 400, which results in lower power consumption.

At sufficiently high input signal frequencies, the gate voltage of transistor 521 may exceed the supply voltage ($V_{DD}$), which makes the drain voltage of transistor 525 very close to $V_{DD}$ while maintaining tracking on the input $V_{IP}$ in terms of both amplitude and phase. Furthermore, transistor 521, positioned between $V_{DD}$ and the drain terminal of transistor 525 also helps to improve the power supply rejection ratio (PSRR) of the output of buffer 500.

Figure 6:
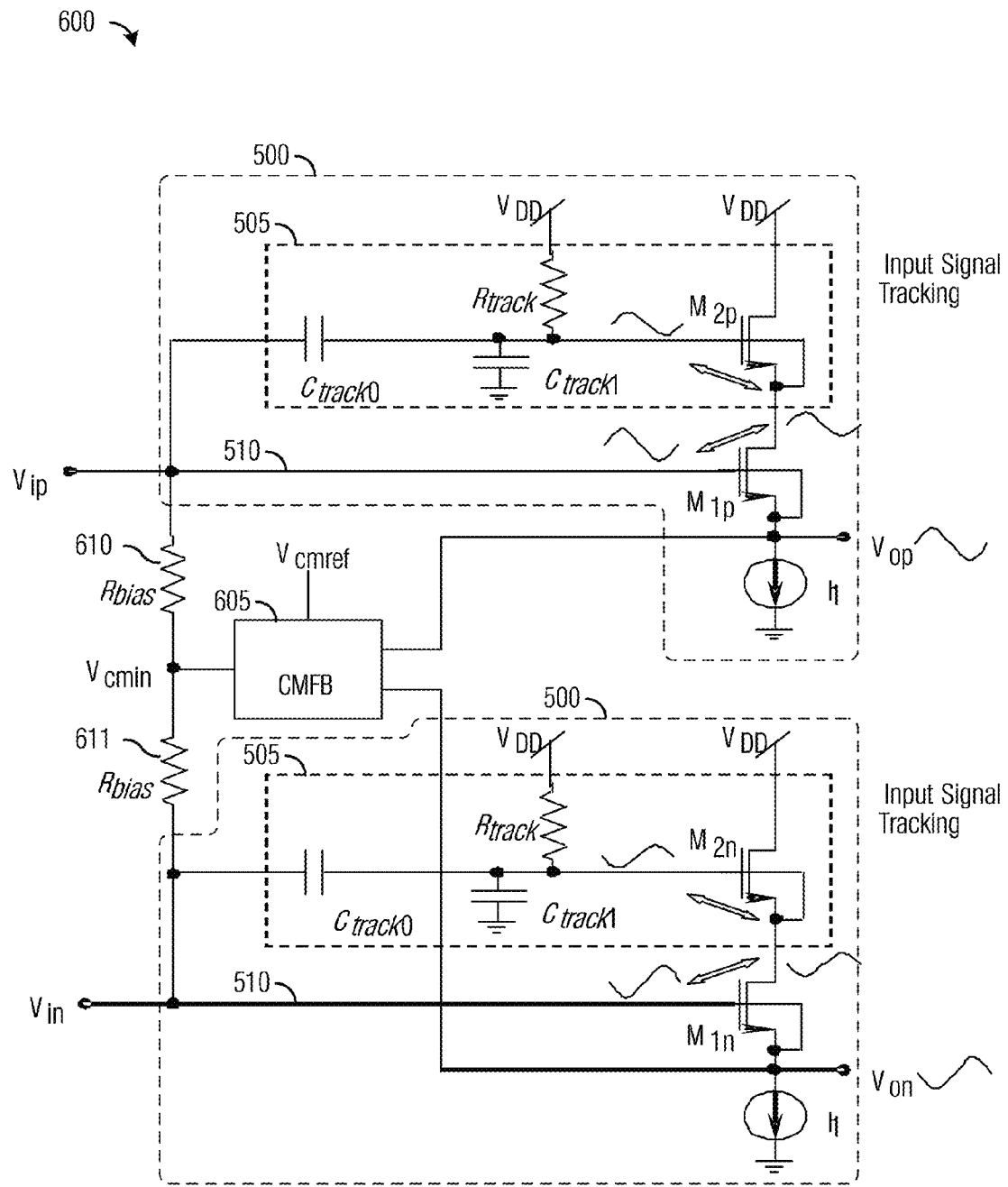
FIG. 6 is a diagram of a fully differential buffer, wherein the buffer has high linearity.

FIG. 6 illustrates a fully differential mode buffer 600, wherein buffer 600 has high linearity. Buffer 600 provides a controlled common mode level buffer output voltage level. As shown in FIG. 6, buffer 600 comprises two buffers 500, with one buffer 500 for each of two input voltage signals. Each buffer 500 provides one of two output voltage signals. For example, a first buffer 500 may have as its input voltage signal $V_{IP}$ and produce an output voltage signal $V_{OP}$, while a second buffer 500 may have as its input voltage signal $V_{IN}$ and produce an output voltage signal $V_{ON}$. The input voltage signals $V_{IP}$ and $V_{IN}$ may be a differential mode input.

Buffer 600 also includes a common mode feedback (CMFB) loop comprised of a CMFB block 605 and biasing resistors 610 and 611. CMFB block 605 may have a reference voltage input ("$V_{CMREF}$") that sets the common mode voltage level at an output of buffer 600 to a pre-selected value. The CMFB loop creates a negative feedback loop that stabilizes the common mode voltage level at differential outputs of buffer 600 ($V_{OP}$ and $V_{ON}$), making it independent of supply voltage level, temperature, process corners, and so forth. CMFB block 605 may be implemented using an operational amplifier.

Simulation studies have shown an improvement of about 15 dB total harmonic distortion (THD) over conventional source follower buffers at higher frequencies.

Advantageous features of embodiments of the invention may include: a circuit comprising: a first transistor having a first gate terminal, a first source terminal, and a first drain terminal; a second transistor having a second gate terminal, a second source terminal, and a second drain terminal, the second drain terminal coupled to the first source terminal; a first signal path coupled in between a signal input and the first gate terminal, the first signal path comprising, a first capacitor coupled in series to the signal input, a second capacitor coupled in parallel to the first capacitor, and a resistor coupled in parallel to the first capacitor; a second signal path coupled in between the signal input and the second gate terminal; and a signal output coupled to the second source terminal. The method could further include, wherein the first transistor comprises a metal oxide semiconductor field effect transistor (MOSFET). The method could further include, wherein the first transistor is an N-channel MOSFET. The method could further include, wherein the second transistor comprises a metal oxide semiconductor field effect transistor (MOSFET). The method could further include, wherein the second transistor is an N-channel MOSFET. The method could further include, wherein the first transistor and the second transistor are arranged in a source follower configuration.

Advantageous features of embodiments of the invention may include: a circuit comprising: a first transistor; a first signal path coupled in between a signal input and a drain terminal of the first transistor, the first signal path configured to produce a level shifted voltage value at the drain terminal of the first transistor, wherein the level shifted voltage value is based on an input signal provided by the signal input; a second signal path coupled in between the signal input and a gate terminal of the first transistor; and a signal output coupled to a source terminal of the first transistor. The method could further include, wherein the first signal path is further configured to eliminate frequency components in the input signal outside of a frequency range. The method could further include, wherein the first signal path comprises: a second transistor having a source terminal coupled to the drain terminal of the first transistor; and a filter coupled in between the signal input and a gate terminal of the second transistor, the filter configured to eliminate frequency components of the input signal outside of the frequency range. The method could further include, wherein the filter is a high pass filter. The method could further include, wherein the frequency range has a lower value, and wherein the high pass filter has a 3 dB frequency corner that is smaller than the lower frequency value of the frequency range.

Advantageous features of embodiments of the invention may include: a circuit comprising: a first buffer having an input coupled to a first signal input, the first buffer configured to buffer a first input signal provided by the first signal input; a second buffer having an input coupled to a second signal input, the second buffer configured to buffer a second input signal provided by the second signal input; and a common mode loop having a first input coupled to a first output of the first buffer and a second input coupled to a second output of the second buffer, the common mode loop configured to set a common mode voltage level of the circuit based on a reference voltage provided by a reference voltage source. The method could further include, wherein the first buffer and the second buffer each comprises: a first transistor; a first signal path coupled in between a signal input and a drain terminal of the first transistor, the first signal path configured to produce a level shifted voltage value at the drain terminal of the first transistor, wherein the level shifted voltage value is based on an input signal provided by the signal input; a second signal path coupled in between the signal input and a gate terminal of the first transistor; and a signal output coupled to a source terminal of the first transistor. The method could further include, wherein the common mode loop comprises an operational amplifier having a first input coupled to the first output of the first buffer and a second input coupled to the second output of the second buffer, and a control input coupled to the reference voltage source.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
   a first transistor having a first gate terminal, a first source terminal, and a first drain terminal;
   a second transistor having a second gate terminal, a second source terminal, and a second drain terminal, the second drain terminal coupled to the first source terminal;
   a first signal path coupled in between a signal input and the first gate terminal, the first signal path comprising a filter, wherein the filter comprises
     a first capacitor having a first terminal coupled the signal input, and having a second terminal;
     a second capacitor having a third terminal directly coupled to the second terminal of the first capacitor, and having a fourth terminal coupled to a first supply voltage; and
     a resistor having a fifth terminal directly coupled to the second terminal of the first capacitor, and having a sixth terminal coupled to a second supply voltage;
   a second signal path coupled in between the signal input and the second gate terminal; and
   a signal output coupled to the second source terminal.

2. The circuit of claim 1, wherein:
   the fourth terminal of the second capacitor is coupled to $V_{DD}$; and
   the sixth terminal of the resistor is coupled to ground.

3. The circuit of claim 1, wherein the first transistor comprises a metal oxide semiconductor field effect transistor (MOSFET).

4. The circuit of claim 3, wherein the first transistor is an N-channel MOSFET.

5. The circuit of claim 1, wherein the second transistor comprises a metal oxide semiconductor field effect transistor (MOSFET).

6. The circuit of claim 5, wherein the second transistor is an N-channel MOSFET.

7. The circuit of claim 1, wherein the first transistor and the second transistor are arranged in a source follower configuration.

8. A circuit comprising:
   a first buffer having an input coupled to a first signal input, the first buffer configured to buffer a first input signal provided by the first signal input;
   a second buffer having an input coupled to a second signal input, the second buffer configured to buffer a second input signal provided by the second signal input; and
   a common mode loop having a first input coupled to a first output of the first buffer and a second input coupled to a second output of the second buffer, the common mode loop configured to set a common mode voltage level of the circuit based on a reference voltage provided by a reference voltage source.

9. The circuit of claim 8, wherein the circuit is a differential mode circuit.

10. The circuit of claim 8, wherein the first buffer and the second buffer each comprises:
    a first transistor;
    a first signal path coupled in between a signal input and a drain terminal of the first transistor, the first signal path configured to produce a level shifted voltage value at the drain terminal of the first transistor, wherein the level shifted voltage value is based on an input signal provided by the signal input;

a second signal path coupled in between the signal input and a gate terminal of the first transistor; and a signal output coupled to a source terminal of the first transistor.

11. The circuit of claim 10, wherein the first signal path comprises:

a second transistor having a source terminal coupled to the drain terminal of the first transistor; and a filter coupled in between the signal input and a gate terminal of the second transistor, the filter configured to eliminate frequency components of the input signal outside of the frequency range.

12. The circuit of claim 11, wherein the filter is a high pass filter.

13. The circuit of claim 12, wherein the frequency range has a lower value, and wherein the high pass filter has a 3 dB frequency corner that is smaller than the lower frequency value of the frequency range.

14. The circuit of claim 8, wherein the common mode loop comprises an operational amplifier having a first input coupled to the first output of the first buffer and a second input coupled to the second output of the second buffer, and a control input coupled to the reference voltage source.

* * * * *